(12) United States Patent
Nieland et al.

(10) Patent No.: US 11,754,934 B2
(45) Date of Patent: Sep. 12, 2023

(54) PROJECTION EXPOSURE APPARATUS FOR SEMICONDUCTOR LITHOGRAPHY HAVING AN OPTICAL ELEMENT WITH SENSOR REFERENCE AND METHOD FOR ALIGNING THE SENSOR REFERENCE

(71) Applicant: Carl Zeiss SMT GmbH, Oberkochen (DE)

(72) Inventors: Peter Nieland, Aalen (DE); Matthias Stepper, Ansbach (DE); Hans-Martin Hoevel, Lippstadt (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 17/475,168

(22) Filed: Sep. 14, 2021

(65) Prior Publication Data

US 2022/0004111 A1    Jan. 6, 2022

Related U.S. Application Data

(63) Continuation of application No. PCT/EP2020/055413, filed on Mar. 2, 2020.

(30) Foreign Application Priority Data

Mar. 20, 2019 (DE) .......................... 102019203838.7

(51) Int. Cl.
*G03F 7/20*    (2006.01)
*G03F 7/00*    (2006.01)

(52) U.S. Cl.
CPC ...... *G03F 7/70833* (2013.01); *G03F 7/70258* (2013.01); *G03F 7/70825* (2013.01)

(58) Field of Classification Search
CPC ............ G03F 7/70833; G03F 7/70258; G03F 7/70825; G03F 7/70141; G03F 7/7085;
(Continued)

(56) References Cited

U.S. PATENT DOCUMENTS

2016/0091798 A1* 3/2016 Pauls ................... G03F 7/7085
355/67
2017/0052453 A1   2/2017 Deufel et al.
2018/0101105 A1   4/2018 Freimann et al.

FOREIGN PATENT DOCUMENTS

DE    10 2010 028 496 A1    11/2011
DE    10 2011 077 315 A1    8/2012
(Continued)

OTHER PUBLICATIONS

Translation of International Search Report for corresponding PCT Appl No. PCT/EP2020/055413, dated Jun. 23, 2020.
(Continued)

*Primary Examiner* — Mesfin T Asfaw
(74) *Attorney, Agent, or Firm* — Fish & Richardson P.C.

(57) ABSTRACT

A semiconductor lithography projection exposure apparatus includes a sensor reference including reference elements. The apparatus also includes an optical element, which includes a main body comprising receiving elements receiving the reference elements. The optical element further includes a referential surface that is an optically active surface of the optical element. The reference elements are arranged to determine a position and an orientation of the optical element. A method includes aligning a sensor reference with respect to a referential surface in a semiconductor lithography projection exposure apparatus.

20 Claims, 8 Drawing Sheets

(58) Field of Classification Search
CPC ... G03F 7/70975; G02B 7/1822; G02B 27/62; G02B 7/182
See application file for complete search history.

(56) References Cited

FOREIGN PATENT DOCUMENTS

| | | |
|---|---|---|
| DE | 10 2015 211 286 A1 | 12/2016 |
| DE | 10 2017 202 863 A1 | 3/2018 |
| DE | 10 2018 218 162 A1 | 12/2018 |
| DE | 102018218162 A1 * | 12/2018 |

OTHER PUBLICATIONS

German Office Action, with translation thereof, for corresponding DE Appl No. 10 2019 203 838.7, dated Oct. 31, 2019.

* cited by examiner

PROJECTION EXPOSURE APPARATUS FOR SEMICONDUCTOR LITHOGRAPHY HAVING AN OPTICAL ELEMENT WITH SENSOR REFERENCE AND METHOD FOR ALIGNING THE SENSOR REFERENCE

CROSS-REFERENCE TO RELATED APPLICATION

The present application is a continuation of, and claims benefit under 35 USC 120 to, international application PCT/EP2020/055413, filed Mar. 2, 2020, which claims benefit under 35 USC 119 of German Application No. 10 2019 203 838.7, filed Mar. 20, 2019. The entire disclosure of these applications are incorporated by reference herein.

FIELD

The disclosure relates to a projection exposure apparatus for semiconductor lithography having an optical element with a sensor reference and a method for aligning the sensor reference with respect to the optical element.

BACKGROUND

In projection exposure apparatuses in semiconductor lithography, the position and orientation of the optical elements can be important to the quality of the imaging—performed by the system—of a lithography mask, e.g. a phase mask, a so-called reticle, onto a semiconductor substrate, a so-called wafer. In order to determine the position and orientation of the optical elements, embodied as mirrors especially in EUV projection exposure apparatuses, sensor systems having six degrees of freedom are used. The sensor systems are embodied as linear encoders, for example, which are distinguished by a relatively high resolution in association with simultaneously a very large measurement range. Linear encoders include a stationary part and a moving part, wherein the working distance, that is to say the distance between the moving part and the stationary part, is usually in the range of a few millimeters. The stationary parts of the sensors are secured to a separately mounted sensor frame, while the moving parts of the sensors are arranged on the mirrors. Generally, the projection optical units in previous EUV projection exposure apparatuses have been characterized hitherto by a folded, very compact design. This greatly simplifies the embodiment of a compact and hence stiff sensor frame. The more recent design variants of the projection optical units can be distinguished for example by a plurality of mirrors which are arranged practically next to one another and which overall occupy a considerable structural space, which can greatly hamper the embodiment of a compact and stiff sensor frame. One possible solution involves the use of interferometers for determining the position and orientation of the mirrors, which likewise have a high resolution and a large measurement range, but the working distance may be in the range of a plurality of centimeters or more. As a result, the fixedly arranged interferometers can be arranged on one or more compact and stiff sensor frames, in which case the reference mirrors, which are lighter and smaller in comparison, can be fitted to the optical elements. As a result of the very stringent desired properties with respect to the accuracy of the position and orientation of the mirrors in the range of a few picometers [pm] or a few tens of microrads [µrad], especially the desired properties regarding the accuracy of the alignment of the orientation of the reference mirrors with respect to the relevant optically active surfaces of the optical elements are in the range of 10-200 µrad. The very small tolerances concerning the total tilting of the sensor references in relation to the interferometers are composed of the installation tolerances, the tilting of the sensor references with respect to the interferometer during operation as a result of the movement of the mirrors and thus of the sensor references in one of the other five degrees of freedom not measured, and a drift portion.

For aligning the angular orientation of sensor references with respect to a referential surface, i.e. for example an optically active surface (that surface on which used light usually impinges during the operation of the apparatus) of an optical element, methods with an adhesive gap between a reflective reference part and a receiving element are known from the literature, wherein the angle between reference part and receiving element is set by way of adhesive layers of nonuniform thickness between reference part and receiving element. The adhesive gap itself can cause a drift of the angles as a result of expansion or contraction of the adhesive during curing and/or over time. This effect can be intensified by the adhesive gaps of varying thickness and the varying magnitude of the drift associated therewith.

SUMMARY

The present disclosure seeks to provide an apparatus which satisfies the desired properties described above and resolves certain known disadvantages. The present disclosure also seeks to provide a method for aligning the sensor reference with respect to the referential surface of an optical element.

A method according to the disclosure for aligning a sensor reference with respect to a referential surface of a main body in an EUV projection exposure apparatus, where the sensor reference includes a reference element and a receiving element, wherein the receiving element is fixedly arranged on the main body or embodied as part of the main body, includes the following steps:
- determining the orientation of the referential surface in a reference coordinate system of the main body;
- determining the deviation of the orientation of the referential surface from the target orientation thereof;
- inserting the reference element into the receiving element;
- determining the position and orientation of the reference element in the reference coordinate system of the main body;
- determining the deviation of the reference element from the target orientation taking account of the previously determined orientation of the reference element and the deviation of the referential surface from the target orientation thereof;
- aligning the reference element with the determined target orientation;
- fixing the orientation of the reference element with respect to the referential surface in the target orientation; and
- checking the target orientation of the reference element in the reference coordinate system.

In this case, the determination of the orientation of the referential surface in the reference coordinate system can be effected interferometrically, for example. To that end, the main body, which can be embodied for example as an optical element, for example as a mirror of an EUV projection exposure apparatus, can be positioned in a measuring machine which, with an interferometer, can determine the deviation of the referential surface with respect to the reference coordinate system, which is defined for example by a reference point on the main body. On account of manufacturing tolerances, the referential surface almost always has a deviation from its target position and orientation which can be deters mined in the manner described.

Furthermore, the receiving element can include a contact surface embodied as a conical seat.

In addition, the reference element can include a contact surface embodied as a spherical surface. The sphere-cone pairing between the receiving element and the reference element can result in the formation of a typically circular contact line enabling an unambiguous and stable orientation of the reference element in the receiving element. The direct mechanical contact thus afforded between the two components can enable the drift between the reference element and the receiving element advantageously to be reduced, for example to a minimum.

For accurate positioning, the reference element can be held by a mount upon being inserted into the receiving element. This is not crucial for a first insertion, but can greatly simplify the setting up of the reference element into the target position and orientation. For example, the mount can have at least one actuator for tilting the mount relative to the receiving element. This can make it possible to set the angle of the reference surface with respect to the angle of the referential surface in the receiving element with a very high resolution.

In some embodiments, the weight of the reference element can be at least partly compensated for by the mount, whereby it can become possible for example also to arrange the receptacle headfirst or laterally. Overall, the normal force can be set in a controlled manner and transverse force-components (such as the weight force in the case of lateral installation) can be compensated for. The normal force at the contact line can be reduced, e.g., minimized, and the friction between the two components can thus be reduced.

In some embodiments, the orientation of the reference element can be determined by way of the orientation of a surface of the reference element. The surface can be the reference surface of the reference element itself. However, a surface with a known alignment relative to the reference surface can be used.

In some embodiments, the orientation of the reference element can be determined by way of the orientation of an auxiliary surface. The auxiliary surface can be embodied on an additional component, an auxiliary element, which can be arranged fixedly with respect to the reference element in terms of position and orientation and has a larger surface area than the reference surface itself. This can allow, for example, the determination of an angle by a probing method more simply or accurately since the reference mirrors may be very small on account of structural space restrictions, which may greatly limit the basis for an angle measurement by probing a plurality of points.

In some embodiments, the orientation of the reference element with respect to the reference coordinate system can be determined by a coordinate measuring machine. Coordinate measuring machines can be capable of measuring large bodies in six degrees of freedom highly accurately in the μm range relative to one another. Coordinate measuring machines are able to be set up flexibly for different main bodies, which can positively influence the process and thus the production costs. This can involve firstly determining the orientation of the main body and hence the reference coordinate system on the coordinate measuring machine. The orientation of the reference element with respect to the reference coordinate system can be subsequently determined. The deviation of the reference element from the target orientation thereof can be determined with the deviation of the referential surface from the target orientation thereof and the orientation of the reference surfaces in the reference coordinate system.

In some embodiments, the orientation of the reference element in the reference coordinate system can be determined by an optical measuring system. In this case, a camera can record the geometry of the reference element, optionally provided with markers, and the position and orientation of the reference element can subsequently be determined with the aid of an image evaluation. The set-up can be simpler and, with the use of so-called time-of-flight cameras, the number of moving parts can be reduced. Furthermore, the measurement can be carried out more rapidly in comparison with the measurement using a coordinate measuring machine since a plurality of points can be captured and determined with one recording. Once the deviation of the orientation and position of the referential surface and the position and orientation of the reference element in the reference coordinate system of the main body have been determined, the deviation of the reference element from the target orientation can be calculated therefrom in a simple manner. The position, i.e. the values on the X-, Y- and Z-axes of the reference coordinate system, can be less important since an error in the measurement direction merely represents an offset and a displacement perpendicular to the measurement direction can be compensated for by the extension of the measurement area. Any deviation of the orientation, that is to say of the tilting about the X-, Y- and Z-axes, can lead to a measurement error of the distance and can be significant particularly for large measurement distances for values in the range of 500-300 μrad (e.g., in the range of 300-100 μrad, in the range of 100-10 μrad).

In some embodiments, during the alignment of the reference element the orientation of the reference element can be determined in situ, that is to say during the alignment itself. This can allow the adjustment or tilting of the reference element to be observed directly and the target orientation to be reached more rapidly as a result.

Furthermore, during the alignment of the reference element, the orientation of the reference element can be determined by an optical measuring device.

For example, the optical measuring device can be an autocollimation telescope. The latter can be particularly suitable for setting tilt angles since the latter have to be indicated directly and not calculated by way of a transformation from a plurality of coordinates. In the case where the auxiliary element is used, with an autocollimation telescope it is possible to determine both the orientation of the auxiliary element, which can be embodied as a semitransparent mirror, for example, with a first reflection and secondly in the same measurement the orientation of the reference element with a second reflection. The orientation of the auxiliary element, which is able to be determined more accurately than that of the reference element, can be transferred as it were to the reference element through the use of the autocollimation telescope.

As an example, in the case of very small reference surfaces, during the alignment of the reference element, the orientation of the reference element can be determined in relation to the auxiliary surface. This can be the case if the orientation of the reference surfaces, which can be in a range of 100 mm×100 mm (e.g., in a range of 45 mm×45 mm, in a range of 20 mm×20 mm), but can also have rectangular geometries, can no longer be determined in the range of the given tolerances when probing the reference surface. As described further above, in this case an auxiliary element can be arranged at a fixed distance and orientation with respect to the reference element. The auxiliary element can thereupon be measured by the coordinate measuring machine, for example, wherein the orientation of the auxiliary element can be determined more accurately than the orientation of the reference element. During the alignment of the reference element with the desired target orientation, it is then possible to align the orientation of the reference element relative to the auxiliary element and thus also relative to the referential surface via the autocollimation telescope.

If the orientation of the reference surface corresponds to the desired target orientation, the latter can be fixed by adhesive bonding to the receiving element, for example. To that end, the adhesive can be applied for example via lateral openings or holes in or in the region of the conical seat of the receiving element from outside into the adhesive gap around the contact line or only above the contact line, such that it is possible to ensure uniform and complete wetting by the adhesive at the periphery. This can lead to a connection having high strength and, as a result of the direct mechanical contact, minimal drift behavior. It is also conceivable to check the complete wetting by the adhesive via a reduced pressure test before curing or via an excess or reduced pressure test after curing. To that end, an excess or reduced pressure can be generated in a space below the contact line in the receiving element.

Furthermore, after the reference element has been fixed in the target orientation, the orientation of the reference element can be checked by a coordinate measuring machine.

In addition, the orientation of the reference element can be checked by an optimal measuring system. As a result of the alignment of the reference surfaces relative to the referential surfaces of the main body that are relevant to the imaging quality in a reference coordinate system, the method can achieve very low orientation tolerances which can be in the range of 500-300 µrad (e.g., in the range of 300-100 µrad, in the range of 100-10 µrad).

A projection exposure apparatus for semiconductor lithography according to the disclosure includes an optical element including, for its part, a main body having receiving elements for a plurality of reference elements of a sensor reference for determining the position and orientation of the optical element. Furthermore, the optical element includes a referential surface embodied as an optically active surface, the orientation of the reference elements being aligned with respect to the orientation of the referential surface. For example, the reference elements are arranged with an angular deviation of less than 100 µrad with respect to the referential surface. The optical elements thus can achieve positioning accuracies which correspond to the desired properties regarding the imaging quality for EUV projection exposure apparatuses. The receiving elements can be arranged and secured as a separate part on the main body or can be embodied as part of the main body, that is to say integrally.

In some embodiments, the receiving elements can include a contact surface embodied as a conical seat.

In addition, the reference elements can include a contact surface embodied as a spherical surface. The sphere-cone pairing reduces the contact of the two contact surfaces to a circular contact line, which can result in a drift-stable mechanical contact between the two components.

Furthermore, the reference elements can be fixed in the receiving elements by an adhesive.

The adhesive can be applied from outside over the entire periphery, such that it can at least partly touch a contact line between the contact surfaces, for example. As a result of the adhesive applied to the entire periphery and cured, it is possible to form a connection with high stiffness and at the same time high drift stability. An adhesive applied to the periphery uniformly can result in a uniform tensile stress during curing and can reduce, e.g., minimize, tilting or warpage of the reference element in the receiving element. Likewise, the adhesive can either flow through the contact line at cutouts or run along it and thus lead to complete wetting of the adhesive gap, but there is no or no significant flow through the contact line. A plurality of geometries are conceivable for the cutouts; they can be arranged on one of the two elements to be connected or else on both elements to be connected. It is also conceivable for the adhesive to be applied at points.

In some embodiments, the contact surfaces of the reference elements and/or of the receiving elements can be at least partly coated in order to reduce the friction. The coating can reduce the frictional forces between reference element and receiving element, thereby simplifying the alignment process.

In addition, the receiving elements can be configured, in a space delimited by a cutout in the receiving elements and the spherical surface of the reference elements, to generate an excess pressure for reducing friction at the contact line or a reduced pressure for monitoring the quality of the connection. Likewise, at least one reference element can include an inspection window for this purpose.

Furthermore, the alignment of the reference element with the target orientation can be effected by changing the geometry of the reference element or the receiving element; alternatively or additionally, this can also be achieved by adapting the thickness of an adhesive gap.

BRIEF DESCRIPTION OF THE DRAWINGS

Exemplary embodiments and variants of the disclosure are explained in more detail below with reference to the drawing, in which.

DESCRIPTION OF EXEMPLARY EMBODIMENTS

Figure 1:
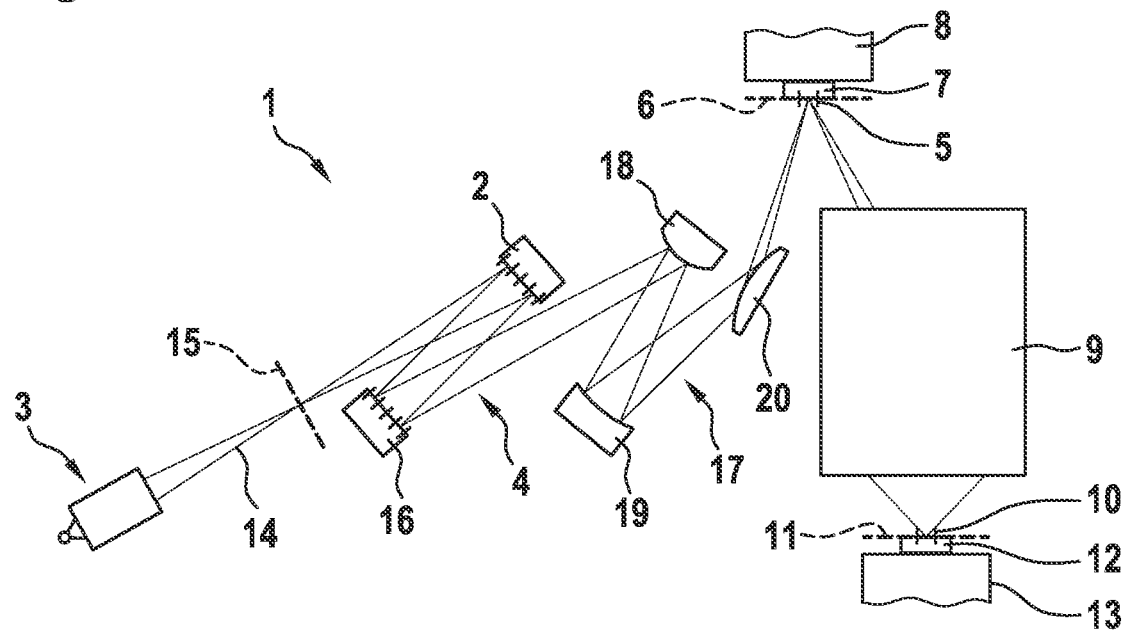
FIG. 1 shows the basic set-up of an EUV projection exposure apparatus.

FIG. 1 shows an example of the basic set-up of a microlithographic EUV projection exposure apparatus 1 in which the disclosure can be used. An illumination system of the projection exposure apparatus 1 has, in addition to a light source 3, an illumination optical unit 4 for the illumination of an object field 5 in an object plane 6. EUV radiation 14 in the form of optical used radiation generated by the light source 3 is aligned via a collector, which is integrated in the light source 3, in such a way that it passes through an intermediate focus in the region of an intermediate focal plane 15 before it is incident on a field facet mirror 2. Downstream of the field facet mirror 2, the EUV radiation 14 is reflected by a pupil facet mirror 16. With the aid of the pupil facet mirror 16 and an optical assembly 17 having mirrors 18, 19 and 20, field facets of the field facet mirror 2 are imaged into the object field 5.

A reticle 7, which is arranged in the object field 5 and held by a schematically illustrated reticle holder 8, is illuminated. A merely schematically illustrated projection optical unit 9 serves for imaging the object field 5 into an image field 10 in an image plane 11. A structure on the reticle 7 is imaged on a light-sensitive layer of a wafer 12 arranged in the region of the image field 10 in the image plane 11 and held by a likewise partly illustrated wafer holder 13. The light source 3 can emit used radiation for example in a wavelength range of between 5 nm and 30 nm.

Figure 2:
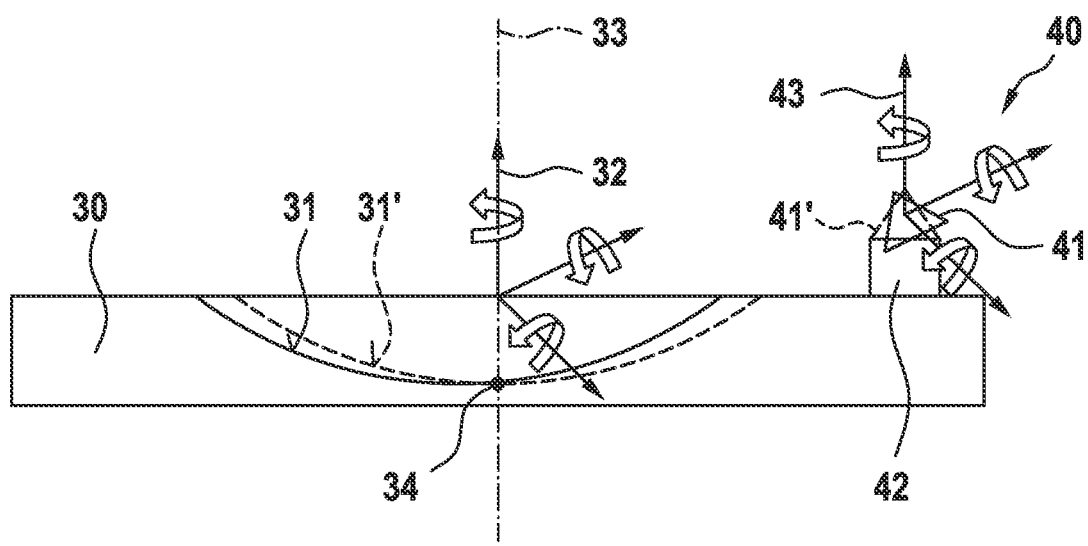
FIG. 2 shows a schematic detail view of an embodiment of the disclosure.

FIG. 2 shows a main body 30, which can be embodied as an optical element 30, for example in the manner of the mirrors 18, 19, 20 of an EUV projection exposure apparatus 1. The main body 30 includes a concavely embodied referential surface 31. The z-axis 33 of a reference coordinate system 32 is illustrated perpendicular to the concave referential surface 31, the z-axis being embodied as an optical axis 33 and running perpendicular to the referential surface 31 and through the vertex 34 thereof. The referential surface 31 deviates from the target referential surface 31', illustrated as a dashed line, owing to manufacturing tolerances. The main body 30 furthermore includes a receiving element 42, which together with a reference element 41 forms a sensor reference 40. The geometry of the receiving element 42 can alternatively also be embodied in the main body 30 and form one part together therewith. The latter can be embodied for example as a reference mirror 40 for an interferometer. A reference coordinate system 43 is likewise assigned to the reference element 41, wherein the z-axis is perpendicular to a reference surface 44 (see FIG. 3A) of the reference element 41. The reference element 41 is aligned with respect to the referential surface 31, such that the orientation of the reference surface 44 compensates for the deviation of the orientation of the referential surface 31 with respect to the main body 30, as a result of which the reference element 41 is perpendicular to the beam path of the interferometer in the zero position, that is to say in the position in which the main body 30 is optimally aligned in the projection optical unit. As a result, the parasitic errors caused by tilting of the reference element 41 with respect to the interferometer beam path can advantageously be minimized. The orientation of the reference element 41' after insertion into the receiving element and before alignment is illustrated by dashed lines.

Figure 3A:
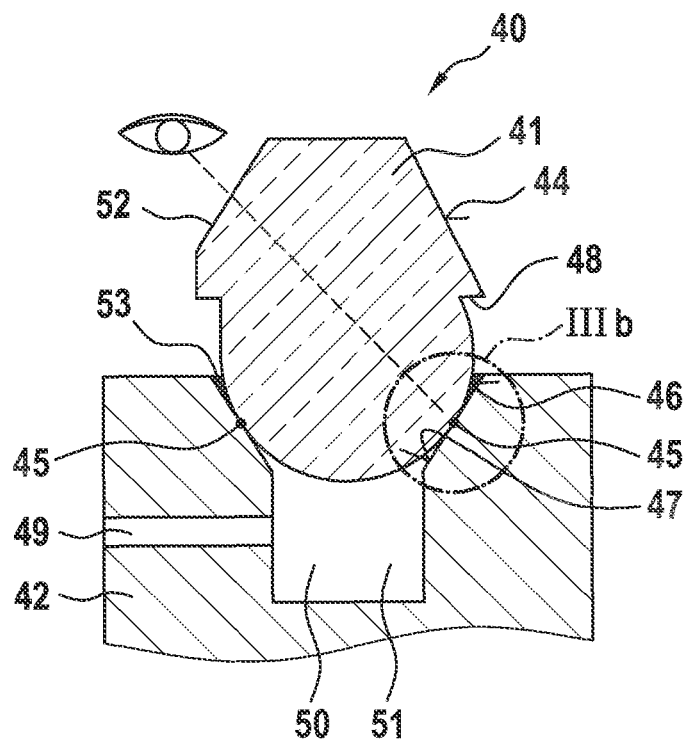
FIG. 3A shows a further schematic detail view of an embodiment of the disclosure.

FIG. 3A shows a sensor reference 40 including a reference element 41 and a receiving element 42. The reference element 41 includes a contact surface 46 embodied as a spherical surface 46 on a first side and the reference surface 44 on a second side. A shoulder 48 is embodied above the spherical surface 46 and serves to allow the reference element 41 to be received in a mount (not illustrated). Besides the shoulder 48 illustrated in FIG. 3A, other structures or surfaces on the reference element 41 are also conceivable for allowing the latter to be received in the mount (not illustrated). The receiving element 42 includes a cutout 50, at the upper end of which a contact surface 47 embodied as a conical surface 47 is embodied. Furthermore, the receiving element 42 includes a hole 49 perpendicular to the cutout 50, which ventilates the space 51 that arises as a result of the spherical surface 46 of the reference element 41 being placed onto the conical surface 47 of the receiving element 42. The spherical surface 46 and the conical surface 47 touch one another at a contact line 45. In order to check the contact and a later adhesive bond 53, which will be explained in greater detail in FIG. 3b, the reference element 41 includes an inspection window 52 allowing the contact line 45 and the adhesive bond 53 to be checked.

Figure 3B:
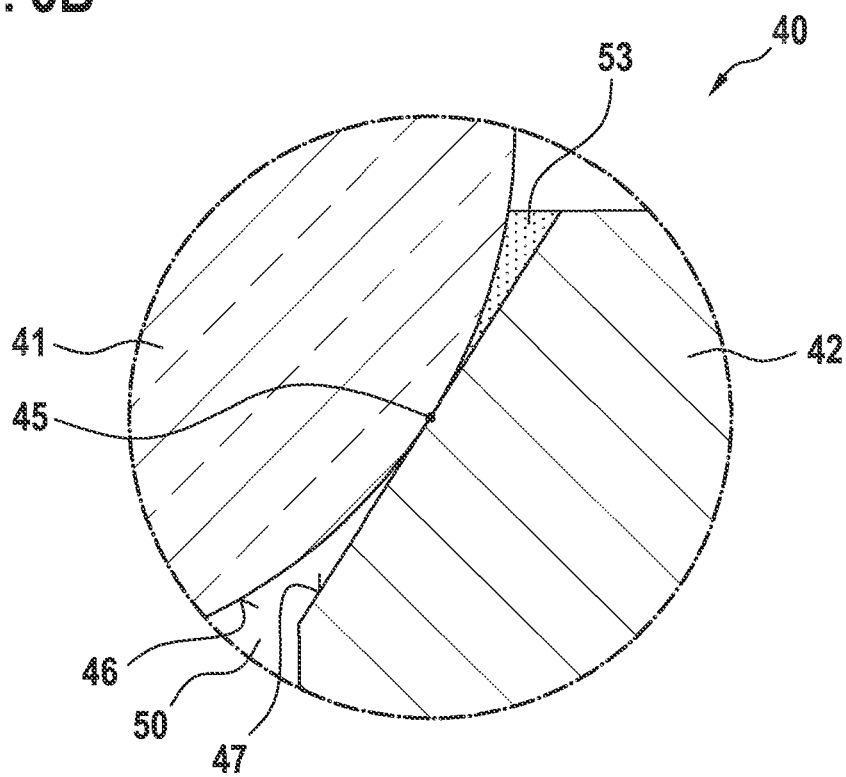
FIG. 3B shows a further schematic detail view of an embodiment of the disclosure.

FIG. 3b shows, in a detail illustration, the contact line 45 and a fixing 53 of the reference element 41 on the receiving element 42, the fixing being embodied as an adhesive bond 53. After the reference element 41 has been aligned, it is fixed by an adhesive bond 53, which is applied over the full periphery from outside and touches the contact line 45. Using capillary action, the adhesive 53 is drawn right up to the contact line 45 and is drawn around and along the sphere periphery, thus giving rise to a stiff connection between reference element 41 and receiving element 42. In order to check the adhesive bond 53, a reduced pressure can be generated in the space 51 below the spherical surface 46 through the hole 49 illustrated in FIG. 3A.

Figure 4:
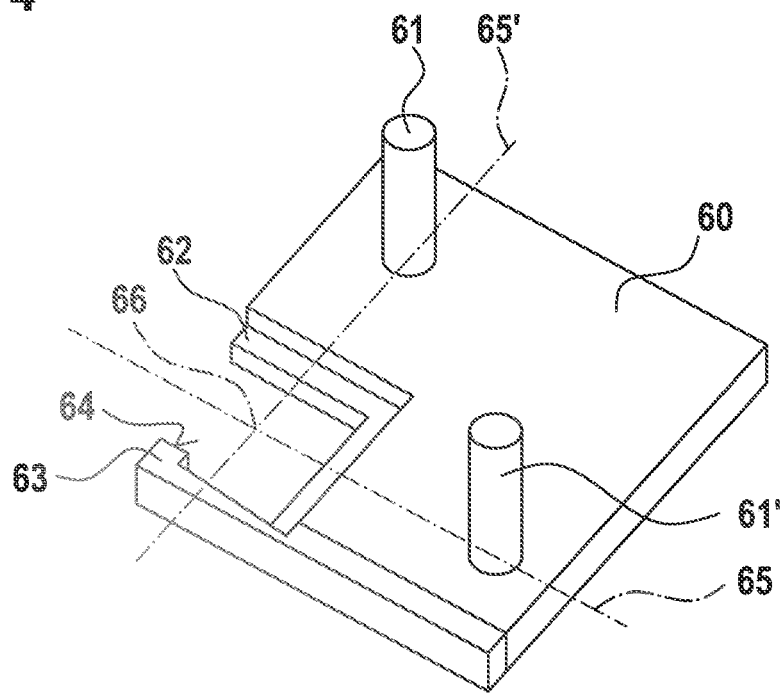
FIG. 4 shows a schematic detail view of an embodiment of the disclosure.

FIG. 4 shows a mount 60 for the reference element 41 (not illustrated in the figure), the mount being used for aligning the reference element 41 with the receiving element 42 and including a receptacle 62. The reference element 41 is inserted into the receptacle 62 of the mount 60 by way of the shoulder 48 illustrated in FIG. 3A. As described further above for FIG. 3A, further alternatives allowing the reference element 41 to be received in the mount 60 are also conceivable. The mount 60 includes two actuators 61, 61' arranged so as to allow the reference element 41 to be tilted about two mutually orthogonal axes around the center point of the spherical surface 46 of the reference element 41, the center point coinciding with the pivot point 66 of the mount. Mounts 60 are also conceivable in which the pivot point 66 of the mount 60 and the center point of the spherical surface 46 do not coincide. The axis of rotation 65 of the first actuator 61 thus runs through the axis of the second actuator 61', and vice versa, wherein the axes of rotation 65, 65' are perpendicular to one another. One side of the mount 60 can be embodied as a solid body with a feed element or alternatively, as illustrated, as a spring 63, which fixes the reference element 41 in the mount 60 by way of the spring contact surface 64 and prevents slipping during the alignment with respect to the receiving element 42. In one alternative, the spring 63 can be moved along the effective direction of the spring 63 by a screw connection, for example, whereby different reference elements 41 can be held by one mount 60, or the force of the spring 63 can be adjusted.

Figure 5A:
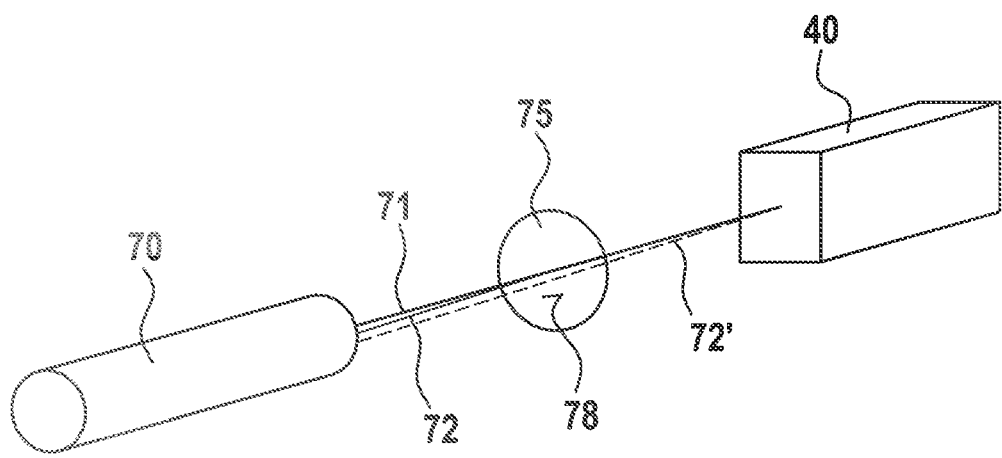
FIGS. 5A and 5B a further schematic detail view of an embodiment of the disclosure.

FIG. 5A shows a schematic arrangement of an autocollimation telescope 70, designated hereinafter as ACT 70, an auxiliary element 75 including an auxiliary surface 78, and the sensor reference 40. The ACT 70 determines the tilting of objects with respect to the optical axis of the ACT 70, wherein a collimated light beam 71 impinges on the object, which reflects the light beam 71, which is subsequently focused on a detector (not illustrated in the figure). A tilting of the object results in migration of the reflected point on the detector. From the distance between the two points or the distance between the reflection 72, 72' on the detector and the zero point of the ACT 70, that is to say the point on the detector which indicates no tilting of the object with respect to the ACT 70, the angle can be determined. The auxiliary element 75 is embodied as a partly transmissive mirror or as a glass plate, such that part of the light beam 71 is reflected at the auxiliary surface 78 and detected by the detector in the ACT 70 and part of the light beam 71 impinges on the reference element 41, which likewise reflects the light beam 71 and generates a further point on the detector. By virtue of the fact that angular orientation of the auxiliary element, owing to the relatively large area thereof, is able to be determined well via a coordinate measuring machine, the orientation of the sensor reference 40 can be deduced reliably and precisely from the relative orientation of the two points with respect to one another or with respect to the zero point.

Figure 5B:
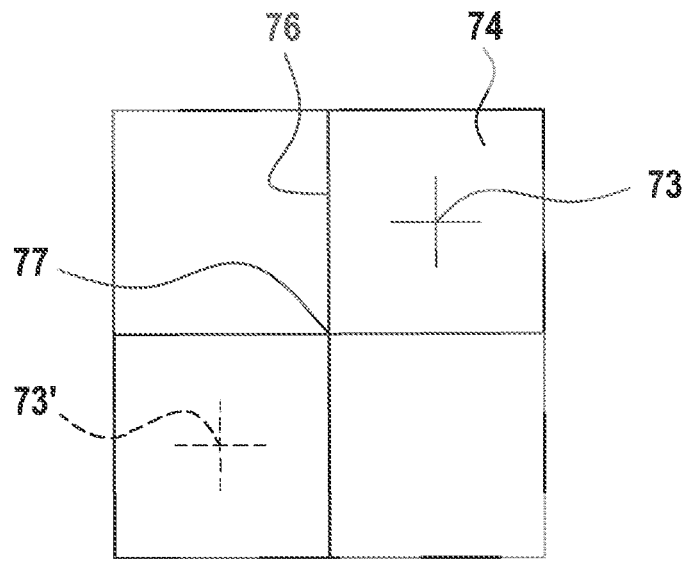

FIG. 5B shows a display 74 of an ACT 70, on which a coordinate system with a zero point and two crosshairs 73, 73' are represented. The crosshair 73 represented by solid lines defines the angle of the auxiliary element 75 and the crosshair 73' represented by dashed lines defines the angle of the reference element 41 with respect to the ACT 70. During the alignment of the reference element 41, the determined deviation from the target orientation is set in relation to the measured auxiliary element 75. Firstly, the reference element 41 is set in such a way that the two crosshairs 73, 73' overlap and, proceeding from this orientation, the deviation from the target orientation is set. It is also possible for the target orientation of the reference element 41 to be set directly without the reference element being aligned parallel with the auxiliary element 75 beforehand.

Figure 6:
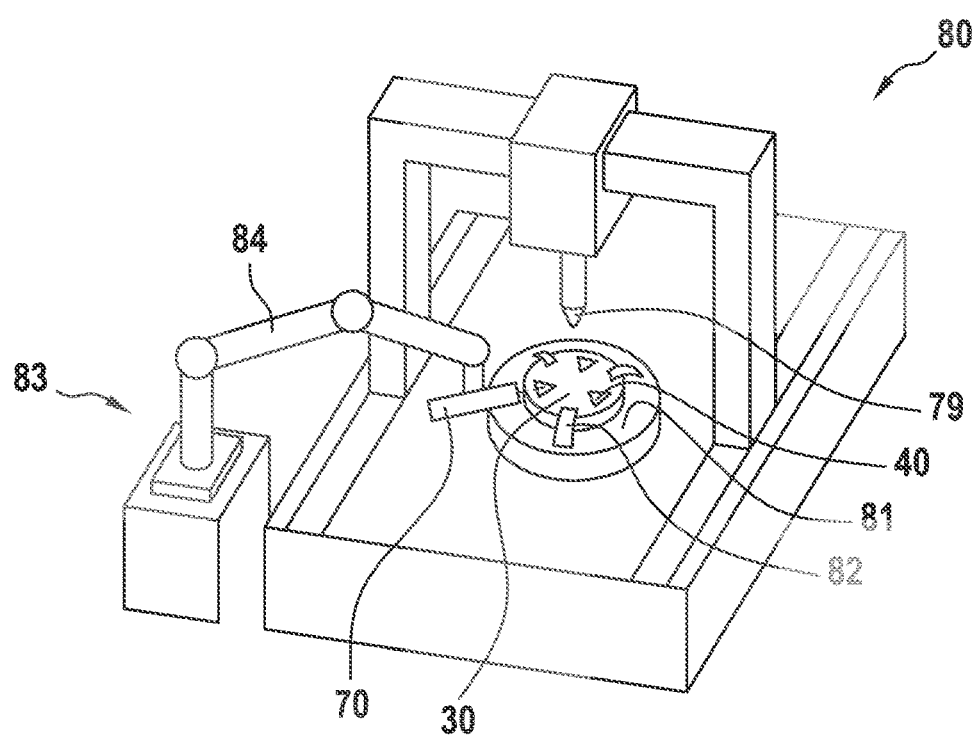
FIG. 6 shows a schematic detail view of an embodiment of the disclosure.

FIG. 6 shows a coordinate measuring machine 80, which is designated hereinafter as CMIM 80, and a robot 83 arranged next to the CMIM 80, an ACT 70 being secured to the arm 84 of the robot. Arranged on the CMM 80 is a receptacle 81 with a fixing 82 configured to receive and fix the main body 30 on which the sensor references 40 are arranged. In addition, the receptacle 81 can also be mounted on a rotary table (not illustrated), thereby also extending the possibilities for the alignment of the main body 30 with respect to the ACT 70. The CMIM 80 firstly determines the orientation of the main body 30 and thus the latter's reference coordinate system 32 (not illustrated) by probing reference points and subsequently determines the orientation of the sensor references 40 in the reference coordinate system 32 of the main body 30 by probing the reference surfaces 44. If the deviation of the sensor references 40 has been determined, the ACT 70 is positioned with the aid of the robot 83 for the measurement of the angle of the reference elements 41, as described in FIGS. 5A and 5B. The ACT 70 determines the angle of the reference surfaces 44 in situ, that is to say continuously, such that the relative alignment of the reference surfaces 44 can be observed at the ACT 70. After the alignment of the reference elements 41, the latter are fixed and the orientation can finally be determined again by the CMM 80 for monitoring purposes.

Figure 7A:
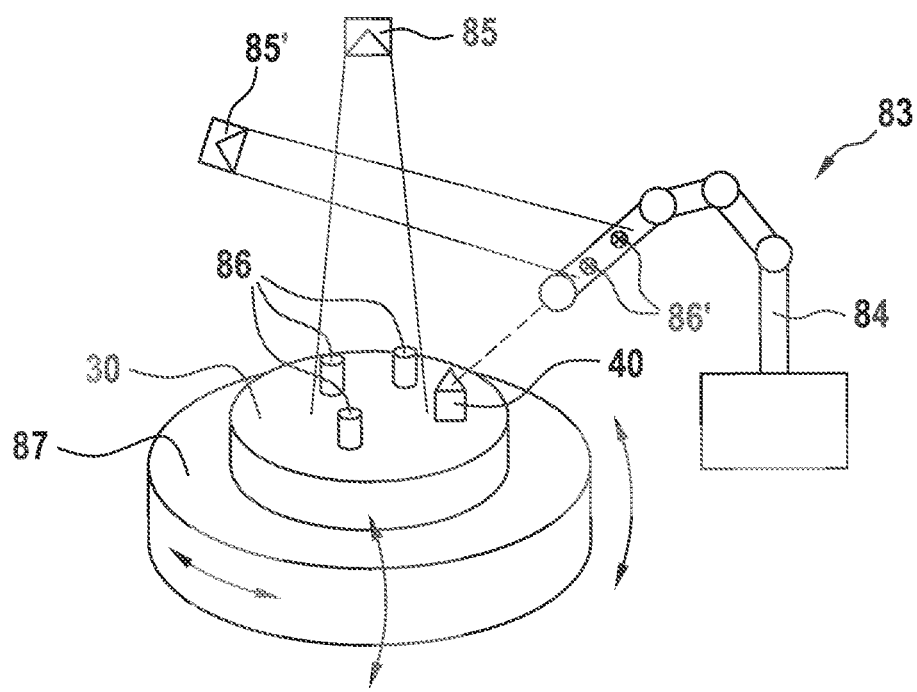
FIGS. 7A and 7B each show a schematic illustration of a measuring device.

FIG. 7A shows an alternative set-up for aligning the reference elements 41, 41' with an optical measuring system 85, 85' embodied as a camera 85, 85', the number and the capture range of the cameras 85, 85' being illustrated purely schematically. By way of example, the measuring system can include 3 cameras, whereby a 3-point referencing of markers is possible, or a so-called time-of-flight camera can be used, which can determine distances using a time-of-flight method. The positions of the cameras 85, 85' of the measuring system 85, 85' are known in space and with respect to one another. With the aid of the markers 86 fitted on the main body 30, the positions of which markers in the reference coordinate system 32 of the main body 30 are known, the measuring system 85 determines the position and orientation of the reference coordinate system 32 of the main body 30 and can then determine the position and orientation of the sensor references 40 in the reference coordinate system 32 by way of one or more images. An ACT 70 secured to an arm 84 of a robot 83 is likewise used for the alignment of the reference surfaces 44 of the sensor references 40. The position and orientation of the ACT 70 is determined via markers 86' captured by a second camera 85' of the measuring system 85, 85'. The main body 30 is arranged on an adjusting table 87. Owing to the use of the adjusting table 87, a fixedly installed ACT 70 can also be used since the reference surfaces 44 can be aligned with respect to the ACT 70 by the adjusting table.

Figure 7B:
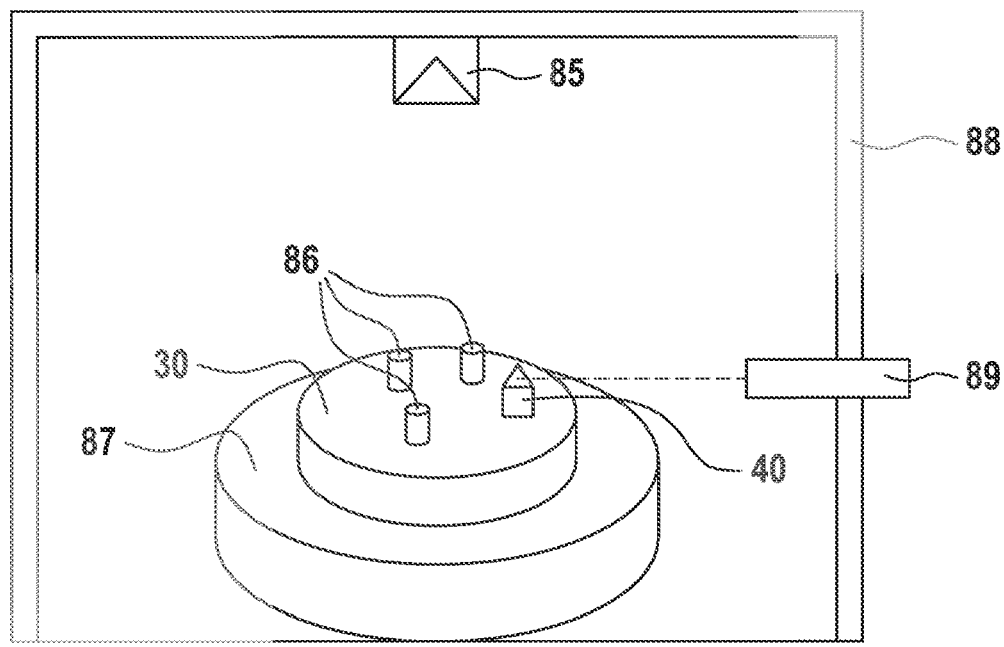

FIG. 7B shows a further alternative set-up for aligning the reference elements 41, 41' in a measuring frame 88 including a fixedly installed camera 85 and an interferometer 89. The system can be calibrated by a so-called golden main body, that is to say a reference main body, wherein the interferometer 89 is aligned in relation to a golden sensor reference 40. For the alignment of the reference elements 41, 41' (not illustrated) of the sensor reference 40, the main body 30 is fixed on an adjusting table 87 that is adjustable in up to six degrees of freedom. The position and orientation of the main body 30 is set in such a way that it corresponds to the position and orientation of the golden main body 30 in the measuring frame 88. The reference elements 41 can then be aligned taking account of the deviation—specific to the main body 30—of the referential surface 31 from the target referential surface 31' via of the calibrated interferometer 89. If the deviation of the referential surface 31 is equal to zero, for example, the reference element is aligned with the position and orientation of the reference element of the golden sensor reference. The measuring set-up has the advantage that the orientation of the reference element 41 does not have to be determined in advance by probing or an optical measuring device since the target position of the reference element 41 can be set in absolute terms by the interferometer 89 calibrated with the golden main body. For the alignment of the reference elements 41 of the sensor references 40 with respect to the fixedly installed interferometer 89, the main body 30 can likewise be correspondingly aligned with the adjusting table 87, wherein the position and orientation of the main body 30 once again corresponds to that of the golden main body for the respective reference element 41. Alternatively, for each sensor reference 40 an ACT 70 (not illustrated) can be arranged in the measuring frame 88, and they can be calibrated with a golden main body with golden sensor references as described above.

Figure 8A:
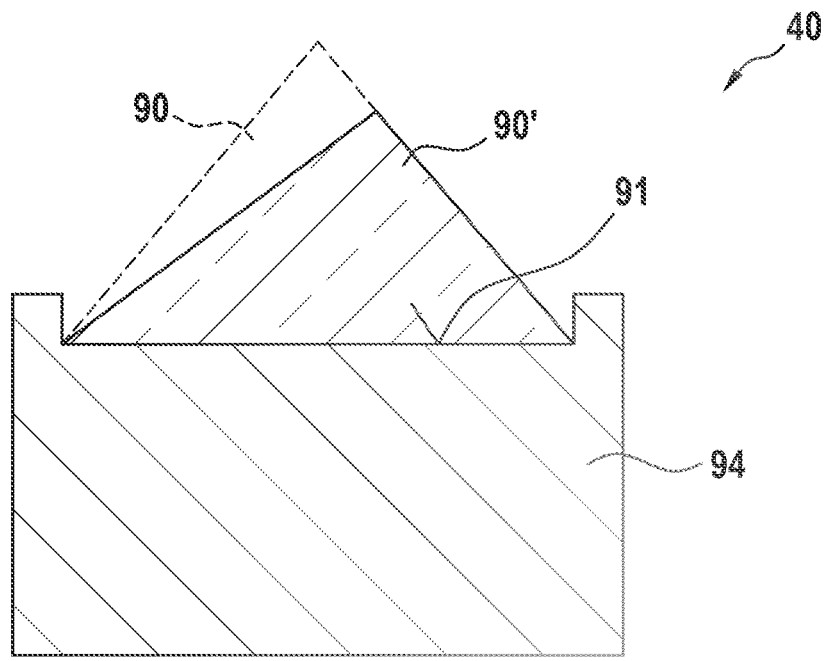
FIGS. 8A and 8B show a further embodiment of the disclosure.
Figure 8B:
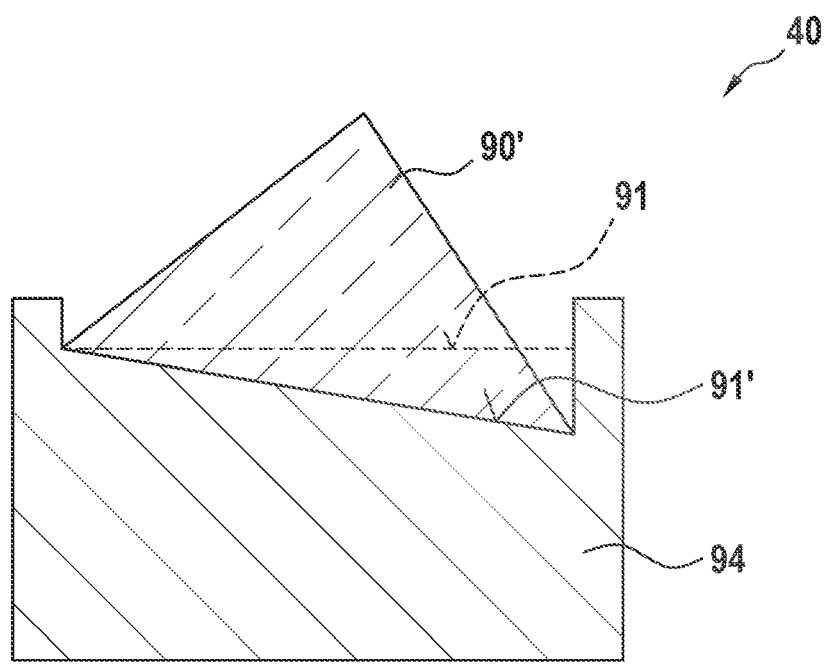

FIGS. 8A and 8B show further alternatives for aligning the orientation of the reference elements 41 of the sensor references 40 with respect to the orientation of the referential surface 31 of the main body 30. After the determination of the deviation of the orientation of a nominal reference element 90 from the target orientation thereof, the reference elements 90, as illustrated in FIG. 8A, are reworked according to the determined deviation and are again connected to the receiving element 42 for renewed checking of the orientation. If the orientation of the adapted reference element 90' is within the range of the tolerances of the target orientation, the reference element 90' is permanently fixed in the receiving element 42. Alternatively or additionally, it is possible to rework the contact surface 91' in the receiving element 94, as illustrated in FIG. 8B, in order to align the orientation of the reference element 41 with the target orientation. The nominal geometry of the reference element 90 in FIG. 8A and that of the receiving element 91 in FIG. 8B are illustrated by dashed lines in each case. The main body 30 and the receiving element 94 can alternatively be embodied in integral fashion. It is also conceivable for the reference element 90' to be processed on the basis of calculated deviations and to be directly connected to the receiving element 94.

Figure 9A:
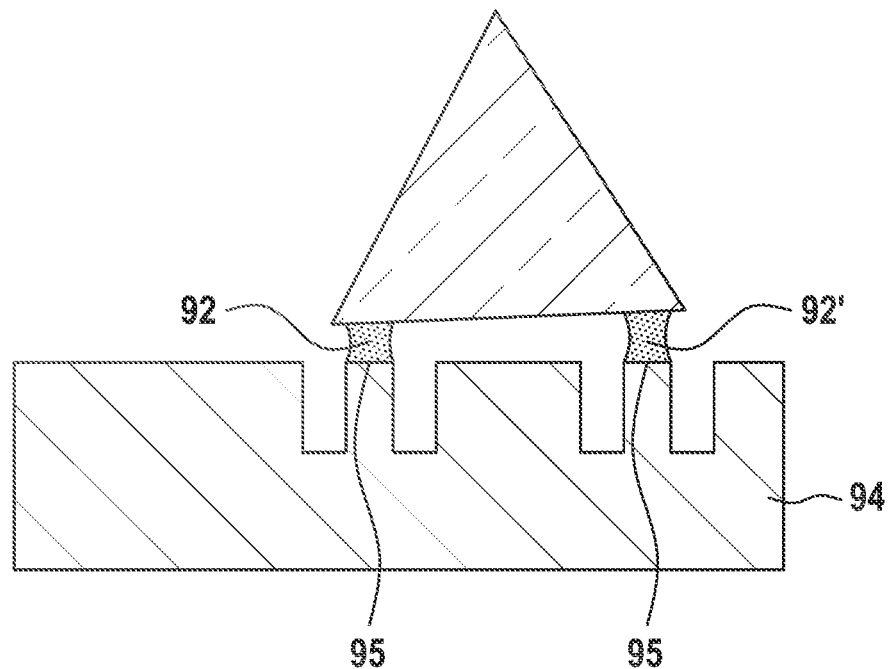
FIGS. 9A and 9B show a further embodiment of the disclosure.
Figure 9B:
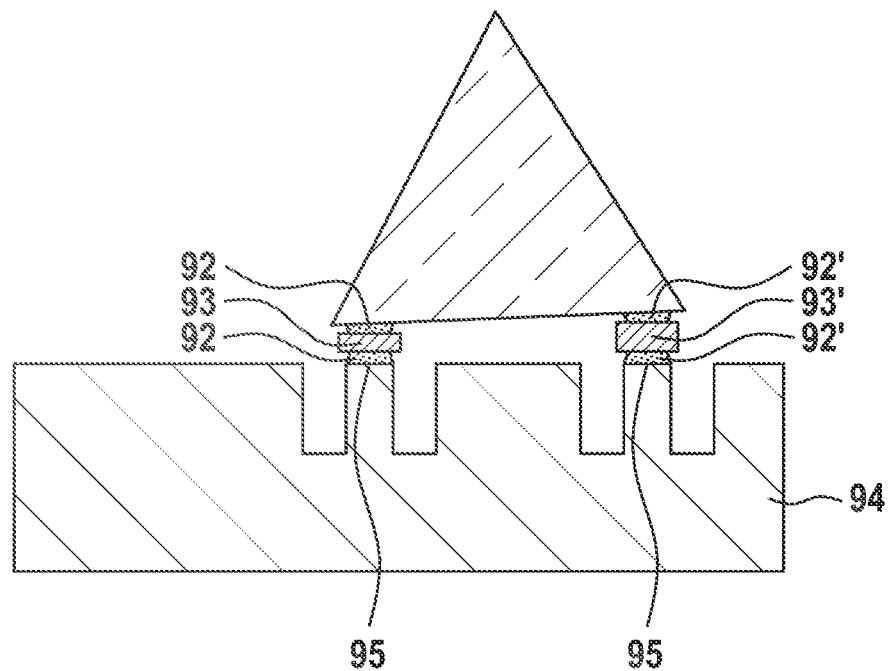

FIGS. 9A and 9B show two alternatives known from the prior art, in which the orientation of the reference elements 41 of the sensor reference 40 is set by way of the thickness of the adhesive gap 92, 92'. In this case, the receiving element 94 includes three contact points 95 in order to ensure a statically determined orientation of the reference element 41. In FIG. 9A, the target orientation of the reference element 41 of the sensor reference 40 is set exclusively by way of the thickness of the adhesive gap 92, 92' at the three bearing points 95.

FIG. 9B shows a modification of the method shown in FIG. 9A in which the adhesive gap 92 and 92' at all contact points 95 is configured to be identical and as small as possible. The different distances—desired for aligning the orientation of the reference element 41 between the reference element 41 and the contact points 95 of the receiving element 94 are achieved via spacer elements 93, 93', so-called spacers 93, 93', of different heights. This has the advantage that the small adhesive thickness enables the drift to be reduced to a minimum.

Figure 10:
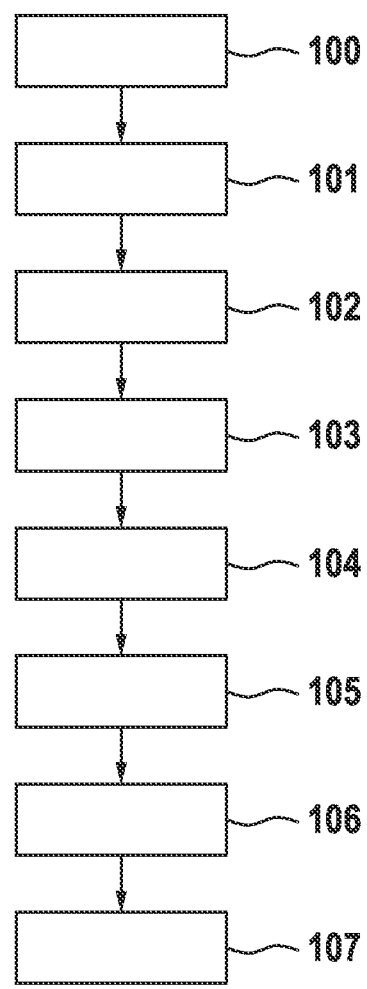
FIG. 10 shows a flowchart for a production method according to the disclosure.

FIG. 10 describes a method according to the disclosure for aligning a sensor reference with respect to a referential surface of a main body in an EUV projection exposure apparatus, wherein the sensor reference includes a reference element and a receiving element, which is arranged on the main body or is embodied as part of the main body.

A first method step 100 involves determining the orientation of the referential surface in a reference coordinate system of the main body.

A second method step 101 involves determining the deviation of the orientation of the referential surface from the target orientation thereof.

A third method step 102 involves inserting the reference element into the receiving element.

A fourth method step 103 involves determining the position and orientation of the reference element in the reference coordinate system of the main body.

A fifth method step 104 involves determining the deviation of the determined orientation and the target orientation of the reference element taking account of the previously determined orientation of the reference element and the deviation of the referential surface from the target orientation thereof.

A sixth method step 105 involves aligning the reference element with the determined target orientation.

A seventh method step 106 involves fixing the reference element in the target orientation.

An eighth method step 107 involves checking the target orientation of the reference element in the reference coordinate system.

With the aid of this method, it is possible to realize the sensor references in a range of 500-300 μrad (e.g., in the range of 300-100 μrad, in the range of 100-10 μrad) which has an advantageous effect on the precision of the control of the orientation of the optical elements in the apparatus.

LIST OF REFERENCE SIGNS

1 Projection exposure apparatus
2 Facet mirror
3 Light source
4 Illumination optical unit
5 Object field
6 Object plane
7 Reticle
8 Reticle holder
9 Projection optical unit
10 Image field
11 Image plane
12 Wafer
13 Wafer holder
14 EUV radiation
15 Intermediate field focal plane
16 Pupil facet mirror
17 Assembly
18 Mirror
19 Mirror
20 Mirror
30 Main body
31, 31' Referential surface
32 Reference coordinate system
33 Optical axis
34 Vertex
40 Sensor reference
41, 41' Reference element
42 Receiving element
43 Reference element coordinate system
44 Reference surface
45 Contact line
46 Contact surface of reference element
47 Contact surface of receiving element
48 Shoulder
49 Hole
50 Cutout
51 Space for excess pressure
52 Inspection window
53 Adhesive
60 Mount
61, 61' Actuator
62 Receptacle
63 Spring
64 Spring contact surface
65, 65' Axis of rotation
66 Pivot point of the mount
70 Optical measuring device, autocollimation telescope
71 Light beam
72, 72' Reflection
73, 73' Crosshair
74 Display
75 Auxiliary element
76 Coordinate system
77 Zero point
78 Auxiliary surface
79 Measuring head of CMM
80 Coordinate measuring machine
81 Receptacle of coordinate measuring machine
82 Fixings of CMM
83 Robot
84 Robot arm
85, 85' Camera
86, 86' Marker
87 Adjusting table
88 Measuring frame
89 Interferometer
90, 90' Reference element (individualizable)
91, 91' Contact surface of receiving element (individualizable)

92, 92' Adhesive gap
93, 93' Spacer
94 Receiving element
95 Contact points; adhesive surface
100 Method step 1
101 Method step 2
102 Method step 3
103 Method step 4
104 Method step 5
105 Method step 6
106 Method step 7
107 Method step 8

What is claimed is:

1. A method of aligning a sensor reference with respect to a referential surface of a main body in an EUV projection exposure apparatus, the sensor reference comprising a reference element and a receiving element, the receiving element being fixed on the main body or a part of the main body, the method comprising:
   determining an orientation of the referential surface in a reference coordinate system of the main body;
   determining a deviation of the orientation of the referential surface from a target orientation thereof;
   inserting the reference element into the receiving element;
   determining a position and an orientation of the reference element in the reference coordinate system of the main body;
   determining a deviation of the reference element from a target orientation thereof taking account of the previously determined orientation of the reference element and the deviation of the referential surface from its target orientation;
   aligning the reference element with its target orientation;
   fixing the orientation of the reference element with respect to the referential surface when the reference element is in its target orientation; and
   checking the target orientation of the reference element in the reference coordinate system,
   wherein the referential surface is configured so that, during use of the EUV projection exposure apparatus, the referential surface reflects EUV radiation.

2. The method of claim 1, further comprising interferometrically determining the orientation of the referential surface in the reference coordinate system.

3. The method of claim 1, wherein the receiving element comprises a contact surface which comprises a conical seat.

4. The method of claim 3, wherein the reference element comprises a contact surface which comprises a spherical surface.

5. The method of claim 1, wherein the reference element comprises a contact surface which comprises a spherical surface.

6. The method of claim 1, further comprising, when the reference element is in the receiving element, using a mount to hold the reference element.

7. The method of claim 6, wherein at least one of the following holds:
   the mount comprises an actuator configured to tile the mount relative to the receiving element; and
   the mount is configured to at least partially compensate a weight of the reference element.

8. The method of claim 1, wherein at least one of the following holds:
   the method further comprises using an orientation of a surface of the reference element to determine the orientation of the reference element; and
   the method further comprises using an auxiliary surface to determine the orientation of the reference element.

9. The method of claim 1, wherein at least one of the following holds:
   the method further comprises using a coordinate measuring machine to determine the orientation of the reference element with respect to the reference coordinate system; and
   the method further comprises using an optical measuring system to determine the orientation of the reference element with respect to the reference coordinate system.

10. The method of claim 1, wherein at least one of the following holds:
    the method further comprises, during the alignment of the reference element, determining the orientation of the reference element in situ; and
    the method further comprises, during the alignment of the reference element, using an optical measuring device to determine the orientation of the reference element.

11. The method of claim 1, further comprising, during the alignment of the reference element, using an autocollimation telescope to determine the orientation of the reference element.

12. The method of claim 1, further comprising using adhesive bonding to the receiving element to fix the target orientation of the reference element.

13. The method of claim 1, wherein at least one of the following holds:
    the method further comprises using a coordinate measuring machine to check the target orientation of the reference element; and
    the method further comprises using an optical measuring system to check the target orientation of the reference element.

14. The method of claim 1, wherein at least one of the following holds:
    the method further comprises changing a geometry of the reference element to align the reference element with its target orientation;
    the method further comprises changing a geometry of the receiving element to align the reference element with its target orientation; and
    the method further comprises adapting a thickness of an adhesive gap to align the reference element with its target orientation.

15. A method of aligning a sensor reference with respect to a referential surface of a main body in an EUV projection exposure apparatus, the sensor reference comprising a reference element and a receiving element, the receiving element being fixed on the main body or a part of the main body, the reference element being in the receiving element, the method comprising:
    determining a deviation of the reference element from a target orientation thereof taking account of an orientation of the reference element in a reference coordinate system of the main body and a deviation of the referential surface from a target orientation thereof in the reference coordinate system of the main body;
    aligning the reference element with its target orientation;
    fixing the orientation of the reference element with respect to the referential surface when the reference element is in its target orientation; and
    checking the target orientation of the reference element in the reference coordinate system, wherein the referential surface is configured so that, during use of the EUV projection exposure apparatus, the referential surface reflects EUV radiation.

16. An apparatus, comprising:
a sensor reference comprising reference elements;
an optical element, comprising;
    a main body comprising receiving elements receiving the reference elements; and
    a referential surface that is an optically active surface of the optical element,
wherein:
    the reference elements are arranged with an angular deviation of less than 100 μrad from the referential surface;
    wherein the referential surface is configured so that, during use of the EUV projection exposure apparatus, the referential surface reflects EUV radiation; and
    the apparatus is a semiconductor lithography projection exposure apparatus.

17. The apparatus of claim 16, wherein at least one of the following holds:
    the reference elements comprise a contact surface which comprises a conical seat; and
    the reference elements comprise a contact surface which comprises a spherical surface.

18. The apparatus of claim 16, further comprising an adhesive configured to fix the reference elements in the receiving elements.

19. The apparatus of claim 18, wherein the adhesive at least partly contacts a contact line between contact surfaces.

20. The apparatus of claim 16, wherein at least one of the following holds:
    contact surfaces of the reference elements and/or contact surfaces of the receiving elements are at least partly coated to reduce friction;
    the receiving elements are configured, in a space delimited by a cutout in the receiving elements and a spherical surface of the reference elements, to generate an excess pressure for reducing friction at the contact surfaces or a reduced pressure for testing the fixing of the reference elements; and
    at least one reference element comprises an inspection window.

* * * * *

UNITED STATES PATENT AND TRADEMARK OFFICE
CERTIFICATE OF CORRECTION

| | |
|---|---|
| PATENT NO. | : 11,754,934 B2 |
| APPLICATION NO. | : 17/475168 |
| DATED | : September 12, 2023 |
| INVENTOR(S) | : Peter Nieland, Matthias Stepper and Hans-Martin Hoevel |

It is certified that error appears in the above-identified patent and that said Letters Patent is hereby corrected as shown below:

In the Specification

Column 3, Line 5, delete "deter mined" insert -- determined --.

Column 6, Line 40, delete "s FIG." insert -- FIG. --.

Column 9, Line 32, delete "CMIM 80," insert -- CMM 80, --.

Column 9, Line 33, delete "CMIM 80," insert -- CMM 80, --.

Column 9, Line 40, delete "CMIM 80" insert -- CMM 80 --.

Signed and Sealed this
Thirty-first Day of October, 2023

Katherine Kelly Vidal
*Director of the United States Patent and Trademark Office*